Sept. 19, 1967 K. R. SCHONIGER 3,343,103

TEMPERATURE COMPENSATED SOLID STATE MICROWAVE OSCILLATOR

Filed Jan. 5, 1966 4 Sheets-Sheet 1

INVENTOR
Kenneth R. Schoniger
BY
Blair, Buckles & Cesari
ATTORNEYS

Sept. 19, 1967 K. R. SCHONIGER 3,343,103

TEMPERATURE COMPENSATED SOLID STATE MICROWAVE OSCILLATOR

Filed Jan. 5, 1966 4 Sheets-Sheet 2

TEMPERATURE COMPENSATED SOLID STATE MICROWAVE OSCILLATOR

Filed Jan. 5, 1966 4 Sheets-Sheet 3

United States Patent Office 3,343,103

Patented Sept. 19, 1967

3,343,103

TEMPERATURE COMPENSATED SOLID STATE MICROWAVE OSCILLATOR

Kenneth R. Schoniger, Tampa, Fla., assignor to Trak Microwave Corporation, Tampa, Fla.

Filed Jan. 5, 1966, Ser. No. 518,829
8 Claims. (Cl. 331—97)

ABSTRACT OF THE DISCLOSURE

The disclosed microwave oscillator includes an electrically conductive housing in which is mounted a transistor having collector, emitter and base terminals. The housing is formed such as to provide distributed parameter emitter and collector tank circuits to which the emitter and collector terminals are respectively electrically coupled. The housing is also partitioned off to provide a frequency doubler cavity. Microwave energy can be extracted from the collector tank circuit at a fundamental oscillator frequency or coupled to the frequency doubler cavity and then extracted at a higher frequency. A positive temperature coefficient resistor is connected in the collector-base DC circuit of the transistor and is effective to maintain the collector-base internal capacitance of the transistor substantially constant despite variations in temperature. Since variations in the internal collector-base capacitance have a pronounced effect on operating frequency, the positive temperature coefficient resistor thus serves to maintain the operating frequency substantially constant irrespective of temperature variations.

*Background and object of the invention*

In the design of microwave transistor oscillators it is a general practice to form resonant circuits by constructing circuitry to exhibit admittances which are conjugate of the input and output admittances of the semiconductor used. Since these resonant circuits determine the frequency of operation, it is necessary that the circuit values remain constant during temperature variations in order to assure stable operation.

Unfortunately, this is not inherently true of the semiconductors themselves, since the dielectric constant of the semiconductor material as well as the diffusion potential will vary with temperature, thereby causing a variation of the terminal admittances and a subsequent change in operating frequency.

It is an object of this invention to provide means for compensating these temperature effects of semiconductors.

A more particular object is to provide electronic means for automatically compensating transistor oscillators for temperature changes, whereby the frequency of oscillation may be maintained constant.

Another object of the invention is to provide an improved solid state oscillator structure employing distributed parameter reactances.

A further object is to provide a unitary structure forming a combined solid state oscillator and frequency doubler.

A general object is to provide a solid state microwave oscillator incorporating the features of the above objects and which is yet small in size and rugged in construction and capable of withstanding high G acceleration forces and vibrations as well as a wide range of temperature variations.

Other objects of the invention will in part be obvious and will in part appear hereinafter.

The invention accordingly comprises the features of construction, combinations of elements, and arrangement of parts which will be exemplified in the constructions hereinafter set forth, and the scope of the invention will be indicated in the claims.

For a fuller understanding of the nature and objects of the invention, reference should be had to the following detailed description taken in connection with the accompanying drawings in which.

Figure 1:
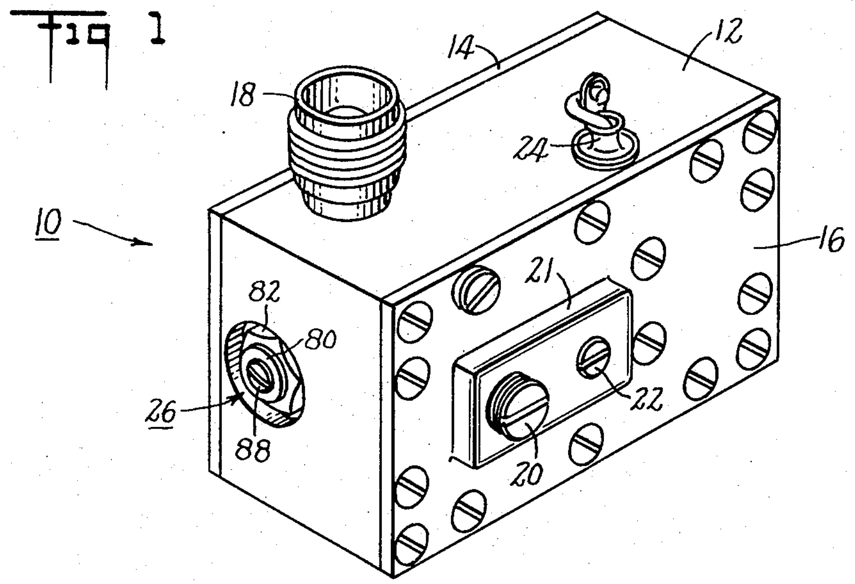
FIGURE 1 is a perspective view of an assembled oscillator embodying the invention.
Figure 5:
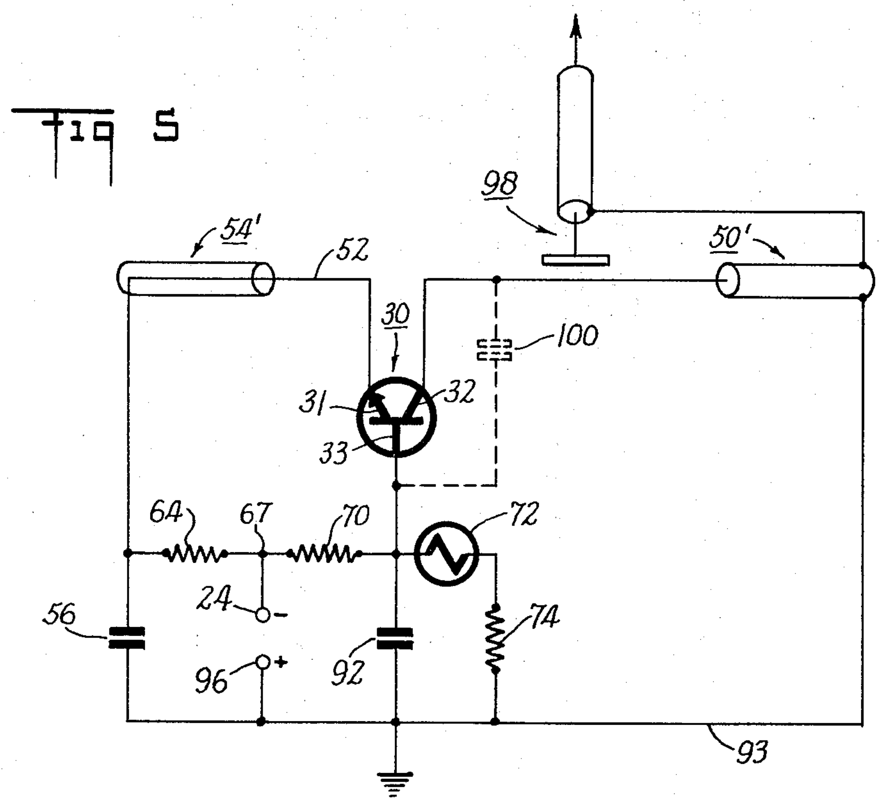
FIGURE 5 is a schematic diagram showing an equivalent circuit of my oscillator invention.

Referring specifically to the drawings, the solid state microwave source constructed according to my invention and generally indicated at 10 in FIGURE 1 has a rectangular housing 12 closed off by a pair of removable cover members 14 and 16. A coaxial output connector 18 is used to extract microwave energy from the source 10 when its frequency doubling capability is utilized. A tuning screw 20 threaded through a boss 21 and through cover member 16 has its inner end adjustably projecting into a distributed parameter circuit of the oscillator source 10 for tuning the fundamental operating frequency. A second smaller tuning screw 22 also threaded through boss 21 and cover member 16 serves to adjustably frequency tune a second distributed parameter circuit of the source 10. When the source 10 is to be used as a fundamental oscillator, a coaxial output connector shown schematically at 98 in FIGURE 5 is substituted for the tuning screw 20 to extract microwave energy of fundamental frequency from the source 10.

An external connection 24 projecting through the rectangular housing 12 to the interior thereof facilitates the application of a suitable supply voltage to the source 10. A tuning screw assembly generally indicated at 26 is utilized in frequency tuning the source 10 operating as a frequency doubler.

Figure 2:
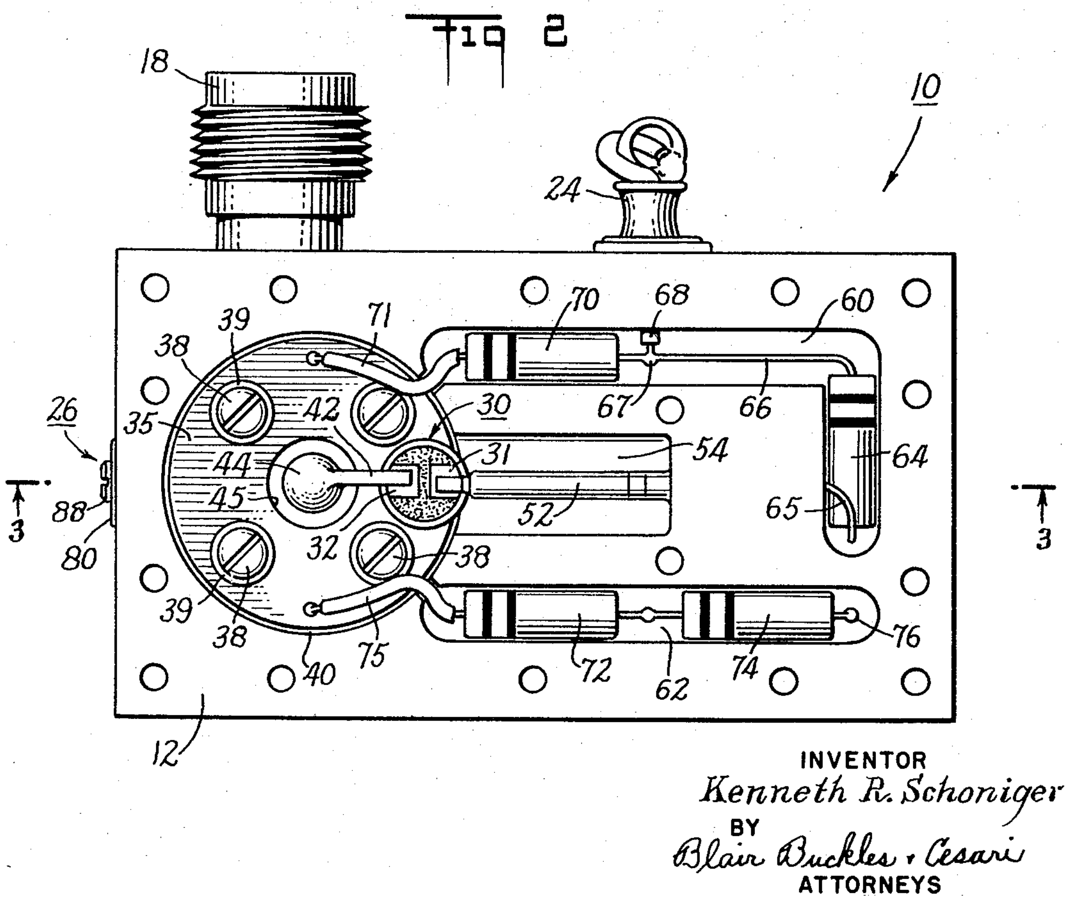
FIGURE 2 is a front view of the oscillator of FIGURE 1, with the side wall 16 removed to show the internal construction.
Figure 3:
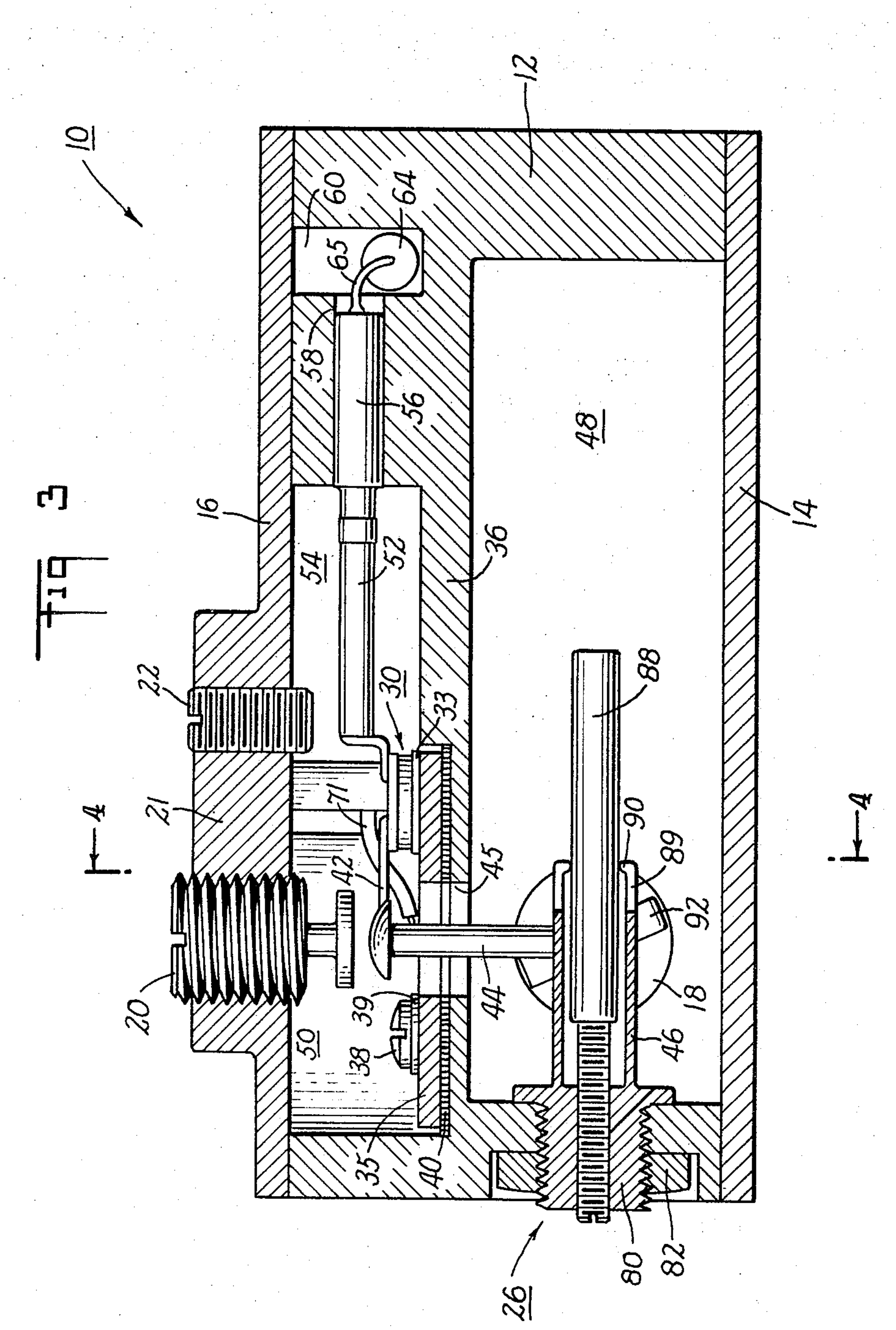
FIGURE 3 is a longitudinal cross sectional view of the oscillator of the invention taken along the line 3—3 of FIGURE 2.

Turning to FIGURES 2 and 3, a transistor generally indicated at 30, has an emitter terminal 31, a collector terminal 32, and a base terminal 33. The transistor 30 may be a TK9511, or its equivalent, such as supplied by Texas Instruments. The base terminal 33 is mechanically bonded and electrically connected to an annular electrically conductive plate 35. The plate 35 is affixed to a central partition 36 of the housing 12 by a plurality of screws 38. The plate 35 is insulated from the housing 12 by sleeve 39 of insulating material associated with each of the screws 38 and also by an annular washer 40 of insulating material interposed between the plate 35 and the housing partition 36. Thus, the base terminal 33 of transistor 30 is insulated from the housing 12 at D.C. but capacitively coupled to the housing at radio frequencies.

The collector terminal 32 of transistor 30 is connected by a conductor 42 to the upper end of a post 44 extending through a common aperture 45 in the plate 35, the insulation 40, and the partition 36. Post 44 is mounted at its bottom end as seen in FIGURE 3 on an outer sleeve 46 of the tuning screw assembly 26 which operates in a distributed parameter frequency doubler cavity 48.

Still referring to FIGURES 2 and 3, the upper end of the post 44 to which the collector terminal 32 is connected is located in a position of maximum field strength in a distributed parameter circuit consisting of post 44, sleeve 46 and the surrounding walls. In FIGURE 3, the tuning screw 20 is shown located adjacent the top of post 44 in order to capacitively tune the fundamental collector tank circuit 50 to the desired operating frequency.

The emitter terminal 31 of the transistor 30 is connected to a rigid central conductor 52 extending centrally through a rectangular cavity 54 operating as a distributed parameter emitter tank circuit.

In FIGURE 3, the tuning screw 22 is shown projecting into the cavity 54 for adjustably frequency tuning the emitter tank circuit. Tuning screw 22 can be omitted by careful design of the cavity 54 such that it exhibits the proper characteristic impedance and/or electrical length. The central conductor 52, as seen in FIGURE 3, is connected to a "feed through" capacitor 56 extending through an interior hole 58 in the housing 12. Capacitor 56 serves to isolate the emitter of transistor 30 from the housing 12 at D.C. yet capacitively coupled together at R.F.

Referring now specifically to FIGURE 2, a pair of elongated grooves 60, 62 are formed in the upper interior surface of the housing 12 to accommodate various lumped parameter circuit elements necessary for applying appropriate bias voltages to the terminals of the transistor 30. A resistor 64, disposed in groove 60, is electrically connected to one terminal of "feed through" capacitor 56 (FIGURE 3) by lead 65; the other terminal of capacitor 56 being connected to the central conductor 52 in the emitter tank circuit. The other terminal of resistor 64 is connected by a lead 66 to a soldered electrical connection 67 with a lead 68 brought through the side wall of the housing 12 from the external terminal 24. Another resistor 70 is electrically connected at one of its terminals to the soldered connection 67 and, at its other terminal, electrically connected by a lead 71 to the plate 35, situated at the bottom of the cavity 50.

Accommodated in groove 62 are a conventional resistor 74 and a resistor 72 having a large positive temperature coefficient, such as a Texas Instruments PN TM1/8 or Veltor Corp. PN VP1/8. Resistor 72 is electrically connected at one terminal to resistor 74 and, at the other terminal, by lead 75 to the plate 35. The other terminal of resistor 74 is connected to the housing 12 as indicated at 76. Thus, the collector 32 of transistor 30 is connected to the housing 12 by the series resistors 72 and 74.

The resistor 72, which possesses a positive temperature coefficient, increases in resistance with increasing temperature. The importance of resistor 72 as regards the operation of the source 10 will be explained later.

Figure 4:
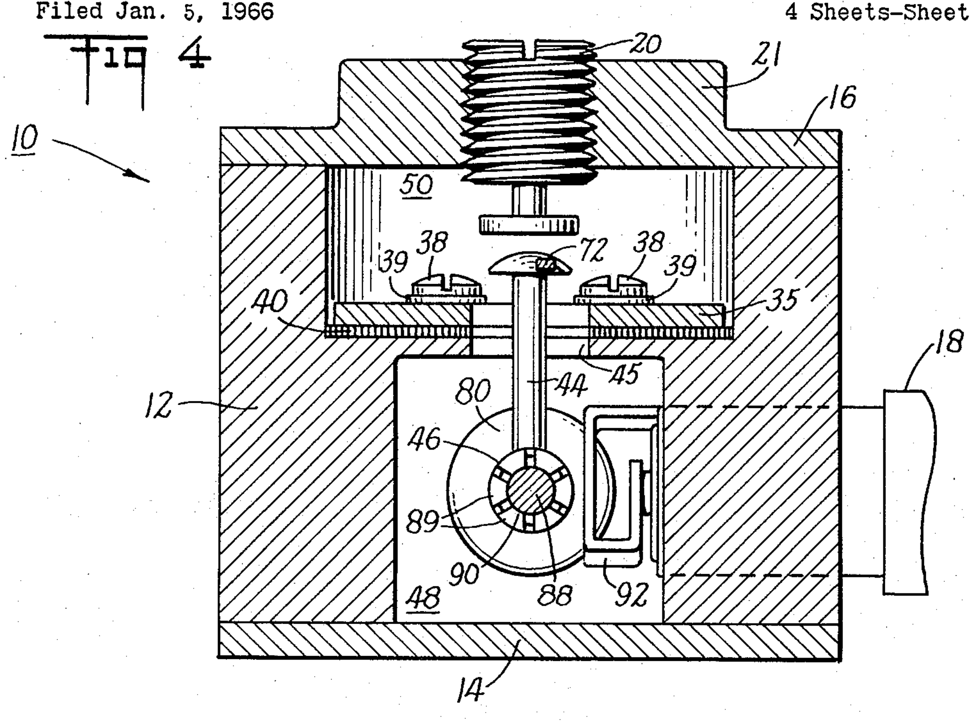
FIGURE 4 is a lateral cross section of the oscillator taken along the line 4—4 of FIGURE 3.
Figure 6:
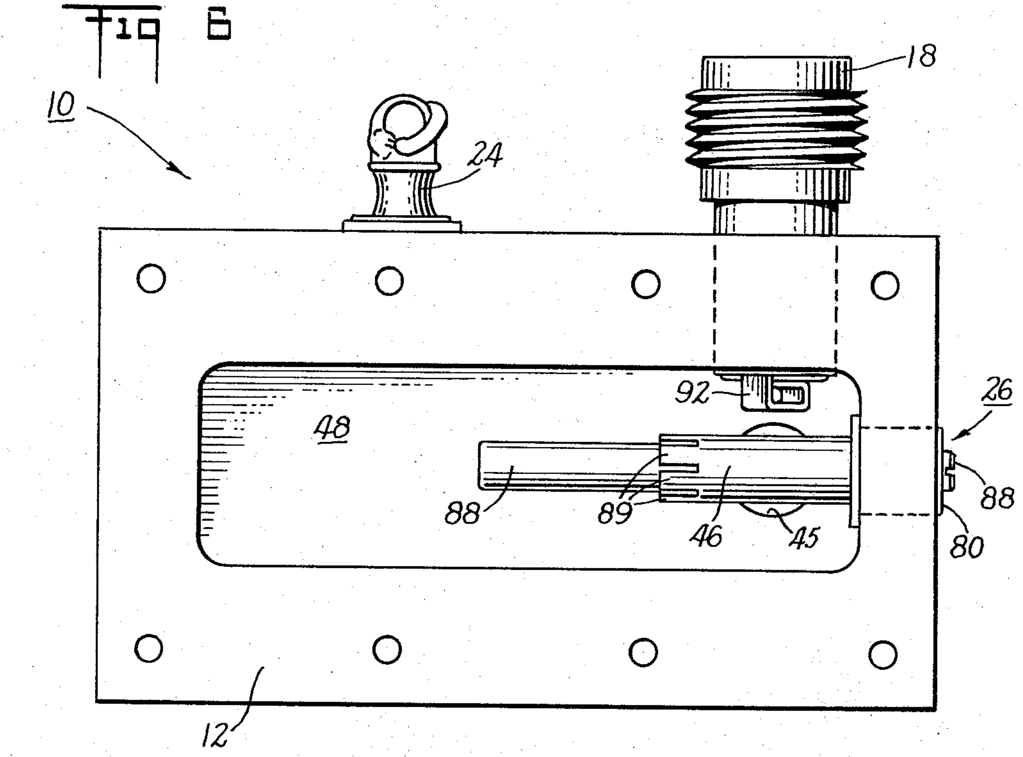
FIGURE 6 is a rear view of the oscillator of FIGURE 1, with the back plate 14 removed to show the internal construction of the frequency doubler portion of my invention.

Referring jointly to FIGURES 3, 4 and 6, the distributed parameter frequency doubler cavity 48 is separated from the collector tank circuit 50 and the emitter tank circuit 54 by the central partition 36 in the housing 12. When utilizing the frequency doubling capability of the source 10, the microwave energy developed by the transistor 30 is coupled from the collector fundamental tank circuit 50 into the frequency doubler cavity 48 by the post 44. The post 44 is electrically connected as well as physically mounted to the sleeve 46 integrally formed on a shank 80 threaded through the end wall of the housing 12. A lock nut 82 threaded on the externally exposed portion of the shank 80 securely mounts the tuning screw assembly 26 to the housing 12. A tuning screw 88 extends centrally through the sleeve 46 and out into the frequency doubler cavity 48. The free end of the sleeve 46 is slotted to form resilient fingers 89 having inwardly turned end portions 90 achieving good electrical connection between the sleeve 46 and the tuning screw 88. Energy from the collector fundamental tank circuit 50 is coupled into the frequency doubler cavity 48 by post 44. The effective length of the tuning screw 88 extending into the cavity 48 is adjusted to establish the proper impedance parameters in the frequency doubler cavity 48 for sustaining the second harmonic of the fundamental frequency microwave energy coupled from the collector tank circuit 50.

As best seen in FIGURES 4 and 6, the coaxial output connector 18 extends through the side wall of the housing 12 to present a coupling loop 92 for extracting the second harmonic microwave energy from the frequency doubler cavity 48 to an output load (not shown).

If it is desired to operate the source 10 as a fundamental oscillator, the tuning screw 20, best seen in FIGURE 3, is replaced by a coaxial output connector indicated schematically at 98 in FIGURE 5 and constructed in the manner of output connector 18, except that a coupling probe rather than a coupling loop is used.

Referring now to the schematic diagram of FIGURE 5 showing the circuitry of the source 10 operating as a fundamental microwave oscillator, the transistor 30 has its emitter terminal 31 electrically connected to the emitter tank circuit, designated 54', and its collector terminal 32 electrically connected to the collector tank circuit, designated 50'. The base terminal 33 of the transistor 30 is capacitively coupled to ground through a capacitor 92 which corresponds to the capacitive coupling provided by the insulating washer 40 (FIGURES 3 and 4). The buss 93 corresponds to the housing 12 of the source 10. The positive temperature coefficient resistor 72 and the resistor 74 are shown connecting the base terminal 33 of the transistor 30 to buss. Capacitor 56 is the "feed through" capacitor coupling the buss 93 (housing 12) to the emitter terminal 31 of transistor 30. Resistors 64 and 70 are shown connected between the base terminal 33 of transistor 30 and the central conductor 52 of the emitter tank circuit 54'. External terminal 24 connected to the junction 67 between resistors 64 and 70 receive the supply voltage for operating the source 10. The other terminal 96 of the supply voltage is connected to buss 93. The coaxial output connector 98 which, as explained above, replaces the tuning screw 20 when the source 10 is operated as a fundamental oscillator.

The most pronounced effect of varying temperatures on the frequency operating point of the transistor 30 is on the collector-base capacitance parameter, indicated at 100. This parameter effects frequency stability more than any other of the transistor parameters. It is found that increases in temperature experienced by the transistor 30 produces an increase in this capacitance 100 causing the operating frequency of the source 10 to decrease. On the other hand, an increase in the collector to base bias voltage of transistor 30 is effective to decrease this output capacitance 100. By incorporating the positive temperature coefficient resistor 72 as a bias resistor in the circuitry associated with transistor 30, temperature increases cause a proportional increase in the resistance of resistor 72 which, in turn, causes an increase in the collector to base bias voltage. Thus, the tendency for the collector-base capacitance 100 to increase with temperature is offset by the increase in the collector to base bias voltage with increasing temperature. The reverse situation also obtains.

Figure 7:
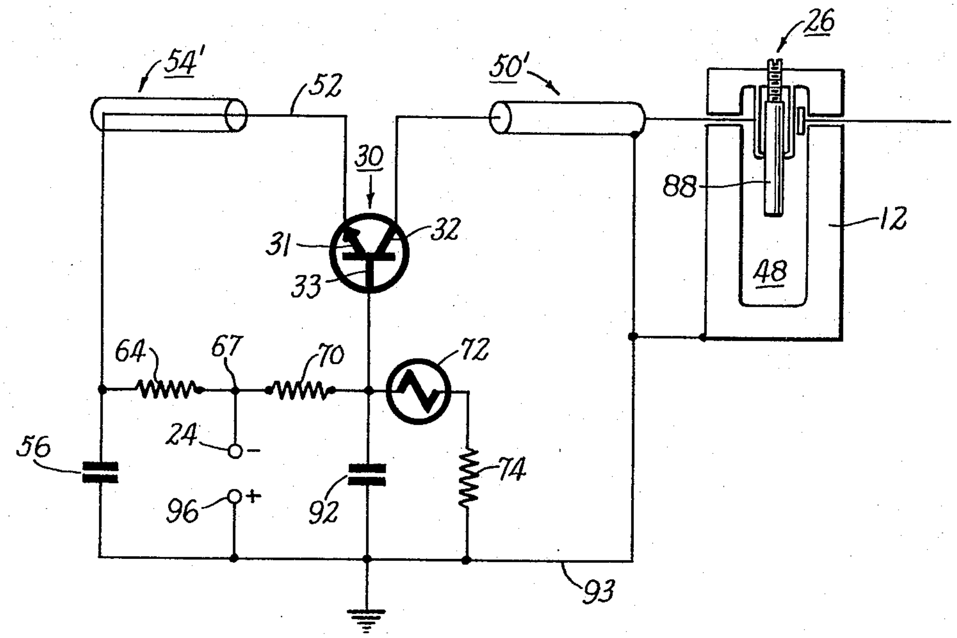
FIGURE 7 is a schematic diagram showing an equivalent circuit of my oscillator invention as embodied in combination with an integral frequency doubler.

The schematic diagram of FIGURE 7, which substantially corresponds to FIGURE 5, shows the circuitry of the source 10 operating as a frequency doubler. The temperature compensation afforded by resistor 72 is as described in connection with FIGURE 5.

It will thus be seen that the objects set forth above, among those made apparent from the preceding description, are efficiently attained and, since certain changes may be made in the above constructions without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention, which, as a matter of language, might be said to fall therebetween.

Having described my invention, what I claim as new and desire to secure by Letters Patent is:

1. A solid state microwave oscillator comprising, in combination:

(A) an electrically conductive housing;

(B) a transistor mounted within said housing, said transistor having (1) a base terminal capacitively coupled to said housing, (2) an emitter terminal, (3) a collector terminal, and (4) an internal collector-base capacitance which increases with increasing temperature, causing reduction in the oscillator operating frequency;

(C) means forming an emitter tank circuit in said housing, (1) said emitter tank circuit electrically coupled to said emitter terminal;

(D) means forming a collector tank circuit in said housing, (1) said collector tank circuit electrically coupled to said collector terminal; and (E) a resistor connected electrically between said base terminal and said collector terminal of said transistor, said resistor (1) having a positive temperature coefficient, and (2) operating to increase the collector-base bias voltage on said transistor with increases in temperature so as to decrease said internal collector-base capacitance and thereby maintain the operating frequency of said oscillator substantially constant irrespective of temperature changes.

2. The device defined in claim 1 which further includes (F) an output connector carried by said housing, said output connector (1) extending into said collector tank circuit so as to extract microwave energy therefrom.

3. The device defined in claim 1 which further includes (F) means forming recesses in said housing; and (G) lumped parameter circuit elements disposed in said recesses (1) said circuit elements developing bias voltages for said transistor.

4. The device defined in claim 1 which further includes (F) means forming a frequency doubler cavity in said housing, (1) said cavity communicating with said collector tank circuit, (2) microwave energy in said collector tank circuit being coupled into said cavity; and (G) an output connector carried by said housing, (1) said output conector extending into said cavity for extracting microwave energy of twice the frequency developed in said collector tank circuit.

5. The device defined in claim 4 which further includes (H) a partition integrally formed in said housing, (1) said partition separating said cavity from said collector tank circuit;

(I) means forming an aperture in said partition; and (J) a conductive post extending through said aperture for coupling microwave energy from said collector tank circuit into said cavity.

6. The device defined in claim 5 wherein the mounting for said transistor comprises (1) an annular plate surrounding said aperture in said partition, (a) said transistor affixed to said plate with said base terminal electrically connected thereto, (2) an annular insulator disposed between said plate and said partition, (3) means affixing said plate to said partition such that said plate is insulated from said partition at D.C. by said insulator but capacitively coupled to said partition at microwave frequencies.

7. The device defined in claim 6 which further includes (K) a tuning screw adjustably projecting into said collector tank circuit; and (L) a tuning screw assembly including (1) a second tuning screw adjustably projecting into said cavity.

8. The device defined in claim 7 wherein (1) said conductive post is mounted at one end by said tuning screw assembly, (2) the free end of said conductive post being disposed in said collector tank circuit and electrically connected to said collector terminal.

References Cited

UNITED STATES PATENTS

| | | | |
|---|---|---|---|
| 3,199,050 | 8/1965 | Schleenbecker | 331—176 X |
| 3,270,292 | 8/1966 | Harwood | 331—97 |
| 3,286,195 | 11/1966 | Bachnick et al. | 331—97 |

ROY LAKE, *Primary Examiner.*

S. H. GRIMM, *Examiner.*